(12) United States Patent
Lee et al.

(10) Patent No.: US 9,224,939 B2
(45) Date of Patent: Dec. 29, 2015

(54) TUNNELING MAGNETORESISTANCE SENSOR

(71) Applicant: Voltafield Technology Corporation, Jhubei, Hsinchu County (TW)

(72) Inventors: Chien-Min Lee, Zhudong Township, Hsinchu County (TW); Kuang-Ching Chen, Beidou Township, Changhua County (TW); Fu-Tai Liou, Zhubei (TW)

(73) Assignee: VOLTAFIELD TECHNOLOGY CORPORATION, Jhubei, Hsinchu County (TW)

( * ) Notice: Subject to any disclaimer, the term of this patent is extended or adjusted under 35 U.S.C. 154(b) by 21 days.

(21) Appl. No.: 14/138,134

(22) Filed: Dec. 23, 2013

(65) Prior Publication Data

US 2014/0103474 A1    Apr. 17, 2014

Related U.S. Application Data

(63) Continuation of application No. 13/333,951, filed on Dec. 21, 2011, now Pat. No. 8,629,519.

(30) Foreign Application Priority Data

Jul. 5, 2011  (TW) .............................. 100123719 A (51) Int. Cl.
| | |
|---|---|
| H01L 43/02 | (2006.01) |
| G01R 33/09 | (2006.01) |
| H01F 10/32 | (2006.01) |
| H01L 27/22 | (2006.01) |

(52) U.S. Cl.
CPC .............. *H01L 43/02* (2013.01); *G01R 33/098* (2013.01); *H01F 10/3254* (2013.01); *H01L 27/22* (2013.01)

(58) Field of Classification Search
CPC ........ B82Y 10/00; B82Y 25/00; C22C 19/07; C30B 23/02; H01L 43/10; G11B 5/3929; G01R 33/098; G01N 27/72
USPC ............. 365/36; 257/421, E21.001, E29.323; 324/693, 252; 438/3
See application file for complete search history.

(56) References Cited

U.S. PATENT DOCUMENTS

| | | | |
|---|---|---|---|
| 2002/0037595 | A1 | 3/2002 | Hosotani |
| 2002/0142490 | A1 | 10/2002 | Sato et al. |

(Continued)

FOREIGN PATENT DOCUMENTS

| | | |
|---|---|---|
| CN | 1345091 A | 4/2002 |
| CN | 1651928 A | 8/2005 |

(Continued)

*Primary Examiner* — Kenneth Parker
*Assistant Examiner* — Bo Fan
(74) *Attorney, Agent, or Firm* — Cheng-Ju Chang (57) ABSTRACT

A tunneling magnetoresistance sensor includes a substrate, an insulating layer, a tunneling magnetoresistance component and a first electrode array. The insulating layer is disposed on the substrate. The tunneling magnetoresistance component is in contact with the insulating layer and includes at least one magnetic tunneling junction unit. The first electrode array disposed in direct contact with the insulating layer. The first electrode array includes a number of first electrodes. Each of the at least one magnetic tunneling junction unit is electrically connected to two neighboring first electrodes of the first electrode array to form a current-in-plane tunneling conduction mode.

11 Claims, 10 Drawing Sheets

(56) References Cited

U.S. PATENT DOCUMENTS

| | | |
|---|---|---|
| 2002/0190291 A1 | 12/2002 | Hosotani |
| 2004/0134876 A1 | 7/2004 | Hosotani |
| 2004/0189295 A1 | 9/2004 | Sato et al. |
| 2004/0212360 A1 | 10/2004 | Sato et al. |
| 2005/0185435 A1* | 8/2005 | Yoshihara et al. ............ 365/36 |
| 2007/0034919 A1* | 2/2007 | Wang et al. ................... 257/295 |
| 2007/0182407 A1 | 8/2007 | Sato et al. |
| 2009/0097168 A1* | 4/2009 | Inomata et al. ............ 360/324.1 |
| 2010/0240151 A1* | 9/2010 | Belen et al. ....................... 438/3 |
| 2010/0264501 A1* | 10/2010 | Furuta et al. .................. 257/421 |
| 2012/0126806 A1* | 5/2012 | Zimmer ....................... 324/252 |

FOREIGN PATENT DOCUMENTS

| | | |
|---|---|---|
| TW | 200805721 A | 1/2008 |
| TW | 201108482 A | 3/2011 |

* cited by examiner

TUNNELING MAGNETORESISTANCE SENSOR

CROSS-REFERENCE TO RELATED APPLICATIONS

This is a continuation application of an application Ser. No. 13/333,951, filed on Dec. 21, 2011, which also claims the benefit of Taiwan Application No. 100123719 of Jul. 5, 2011. The entirety of the above-mentioned patent applications is hereby incorporated by reference herein and made a part of this specification.

FIELD OF THE INVENTION

The present invention relates to a tunneling magnetoresistance sensor, and particularly to a current-in-plane tunneling magnetoresistance (CIP-TMR) sensor.

BACKGROUND OF THE INVENTION

Recently, the tunneling magnetoresistance (TMR) mechanism has been widely employed for magnetic random access memory (MRAM) and magnetoresistance sensor applications. For example, a tunneling magnetoresistance sensor is frequently used as a rotary position sensor to sense an angular variation with high accuracy. Due to its higher magnetoresistance ratio and higher electrical resistance than a typical giant magnetoresistance (GMR) sensor, the TMR sensor has shown benefits in higher output signal, wider detection airgap and lower power consumption.

A conventional TMR device is based on the magnetic tunnel junction (MTJ) design, which comprises two ferromagnetic layers (a top ferromagnetic layer and a bottom ferromagnetic layer) separated by a thin tunnel dielectric layer. The magnetoresistance is read by applying an electric current vertically through the top ferromagnetic layer, the tunnel dielectric layer and the bottom ferromagnetic layer. In other words, the electric current has a flow direction perpendicular to the normal plane of the TMR device and conducts an upper electrode and a lower electrode adjacent to the top and the bottom ferromagnetic layers, respectively. Thus, the magnetoresistance sensor using such current conduction mode is called a current-perpendicular-to-plane tunneling magnetoresistance (CPP-TMR) sensor.

However, because the upper electrode and the lower electrode are spatially arranged on both sides of the CPP-TMR sensor, it means two metal layers are required in the structural design and the manufacturing process, which are more complicated compared with those of conventional AMR and GMR sensors.

SUMMARY OF THE INVENTION

The present invention provides a TMR sensor that can be formed by a simplified manufacturing process, thereby reducing the production cost.

The present invention provides a TMR sensor with high sensing signal and sensitivity.

The present invention provides a TMR sensor including a substrate, an insulating layer, a TMR component and a first electrode array. The insulating layer is disposed on the substrate. The TMR component is in contact with the insulating layer. The TMR component includes at least one MTJ unit. The first electrode array is disposed in contact with the insulating layer. The first electrode array includes a number of first electrodes. The first electrodes are electrically connected to the TMR component to form a current-in-plane tunneling conduction mode, wherein each of the at least one MTJ unit is electrically connected to two neighboring first electrodes of the first electrode array.

In the present invention, the TMR sensor can function with only one electrode array. That is, only one metal layer is required for reading the TMR signal. Such configuration with the electrodes on one side of the TMR component is referred to as current-in-plane tunneling magnetoresistance (CIP-TMR). In comparison with conventional CPP-TMR sensor, the CIP-TMR sensor of the present invention can be manufactured with less metal layers, thereby reducing the production cost.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
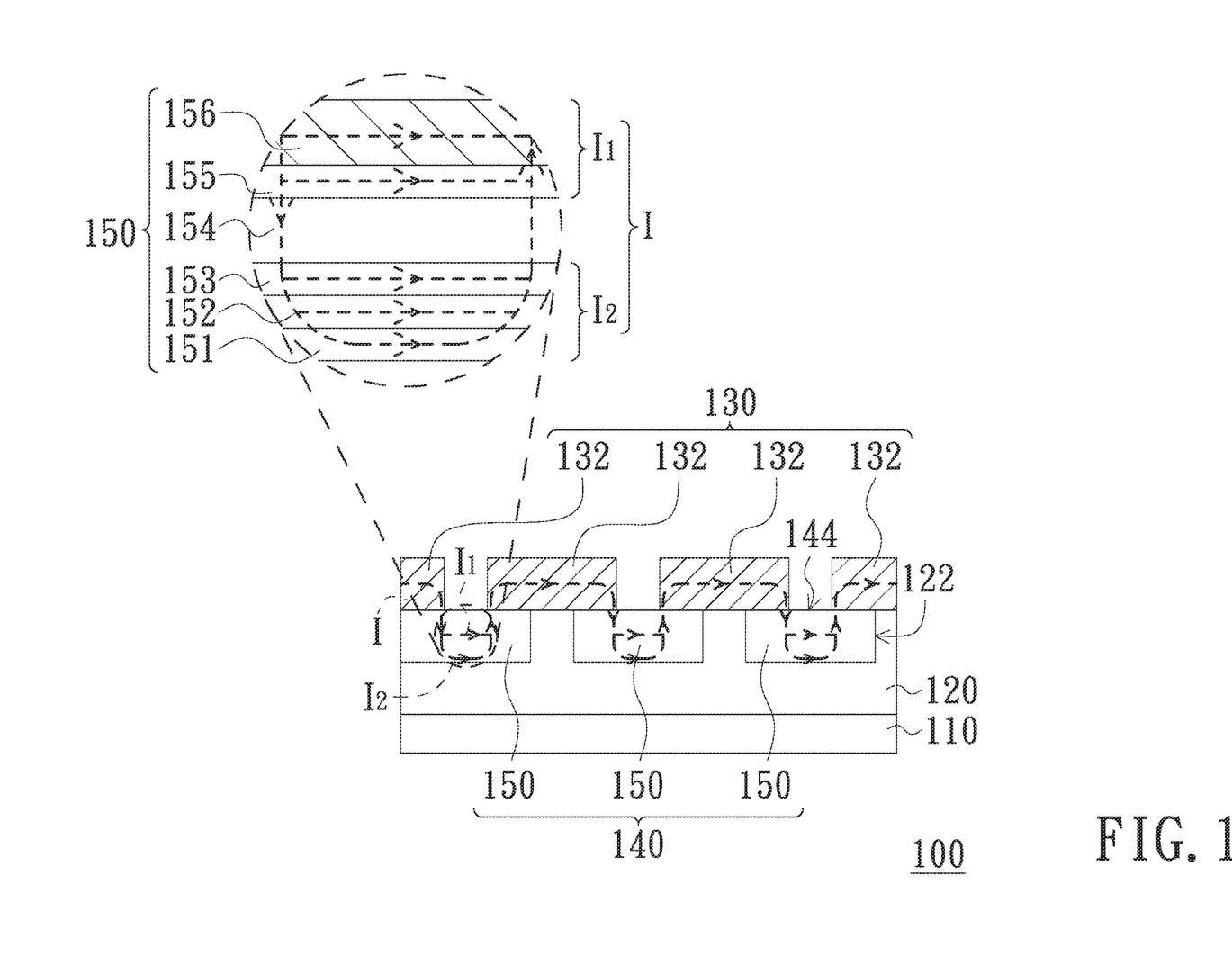
FIG. 1 illustrates a partial, cross-sectional, schematic view of a TMR sensor in accordance with an embodiment of the present invention.

FIG. 1 illustrates a partial, cross-sectional, schematic view of a TMR sensor in accordance with an embodiment of the present invention. Referring to FIG. 1, a TMR sensor 100 includes a substrate 110, an insulating layer 120, an electrode array 130 and a TMR component 140. The substrate 110 can be, for example, a silicon substrate covered by an insulating material or a silicon wafer having front-end logic circuits. The insulating layer 120 is formed on the substrate 110. The TMR component 140 is embedded in the insulating layer 120. In the present embodiment, the TMR component 140 includes a number of magnetic tunneling junction (MTJ) units 150. The MTJ units 150 are separated from each other. In detail, in the present embodiment, in a process of manufacturing the TMR sensor 100, firstly a lower insulating layer (not labeled) is formed on the substrate 110. Then, the MTJ units 150 are formed on the lower insulating layer. Next, an upper insulating layer (not labeled) may be formed to cover the MTJ units 150 and the lower insulating layer. The upper insulating layer and the lower insulating layer constitute the insulating layer 120. A chemical mechanical polishing process is then performed so that the upper surface of the upper insulating layer is planarized and a number of openings 122 are formed in the insulating layer 120. The MTJ units 150 are embedded in the openings 122 and the top surfaces of the MTJ units 150 are exposed from the insulating layer 120. There is another manufacturing process which may not involve the deposition of the upper insulating layer. Next, the electrode array 130 is formed on the MTJ units 150 and the insulating layer 120. An additional passivation layer (not shown) can also be applied on the TMR sensor 100 for protection and reliability concern.

The electrode array 130 includes a number of electrodes 132. The electrodes 132 are separately disposed on the insulating layer 120 and the MTJ units 150, and electrically connected to the MTJ units 150. That is, the electrode array 130 is adjacent to and electrically in contact with the TMR component 140. The electrodes 132 of the electrode array 130 are formed in a single metal layer. In the present embodiment, a material of the electrodes 132 is, for example, aluminum. In detail, two neighboring electrodes 132 are electrically connected to a common MTJ unit 150 on both ends. The MTJ units 150 and the electrodes 132 are arranged alternately in the form of contact chain. That is, each electrode 132 is disposed between and electrically connected to two neighboring MTJ units 150, and each MTJ unit 150 is disposed between and electrically connected to two neighboring electrodes 132.

It is noted that, the contact chain formed by alternate MTJ units 150 and the electrodes 132 may not be aligned in a straight line. The MTJ units 150 should have identical shape and dimension, and should be aligned in parallel in the same direction. While the electrodes 132 do not have the same limitations. It means the contact chain may appear in a serpentine-like structure for ease of routing purpose.

Additionally, it is familiar that the electrodes 132 are electrically connected to a circuit by metal interconnections or other means. In order to expressively illustrate the TMR sensor 100, the detailed electrical connection of the electrodes 132 to the circuit is not shown in FIG. 1.

Again, referring to FIG. 1, in the present embodiment, each of the MTJ units 150 includes a pinned layer 153, a free layer 155 and a tunnel barrier 154 in between.

Specifically, the MTJ units 150 may further include a seed layer 151, an exchange bias layer 152 and a hard mark 156. The seed layer 151, the exchange bias layer 152, the pinned layer 153, the tunnel barrier 154, the free layer 155 and the hard mark 156 are stacked on the insulating layer 120 sequentially in that order. In another embodiment, the seed layer 151, the free layer 155, the tunnel barrier 154, the pinned layer 153, the exchange bias layer 152 and the hard mark 156 can also be stacked on the insulating layer 120 sequentially in that order.

The seed layer 151 is firstly formed so that the subsequent layers can grow with a good texture and a preferred orientation. The exchange bias layer 152 is configured to fix a magnetization direction of the pinned layer 153. The exchange bias layer 152 is made of an anti-ferromagnetic material. The pinned layer 153 and the free layer 155 are made of a ferromagnetic material comprising iron, cobalt, nickel or combination thereof. For example, the pinned layer 153 and the free layer 155 can be a pure-element layer, an alloy layer or a composite layer which belongs to the ferromagnetic material. The magnetization direction of the pinned layer 153 is fixed due to the interlayer exchange coupling effect with the exchange bias layer 152. The magnetization direction of the free layer 155 is variable when under an applied magnetic field. Such angel variation between the magnetization direction of the free layers 155 and the magnetization direction of the pinned layers 153 leads to change in resistance value. The tunnel barrier 154 has a high selectivity with respect to spin electrons in different states and accounts for high TMR ratio. A material of the tunnel barrier 154 can be, for example, aluminum oxide or magnesium oxide. The hard mark layer 156 is made of a high etching selectivity material, for example, tantalum or chrome silicide, during etching the ferromagnetic material.

According to the principle of the current-in-plane tunneling, (CIPT), the MTJ units 150 should have an optimum current traveling distance. Thus, when an electric current I flows from one electrode 132 of the electrode array 130 into the MTJ unit 150 electrically connected to the one electrode 132, one portion (i.e., partial current I1) of the electric current I flows directly through the hard mark layer 156 and the free layer 155 parallel to the reference plane 144 and arrives at the other electrode 132 connected to the same MTJ unit 150. Meanwhile, the other portion (i.e., partial current I2) of the electric current I tends to form a secondary path so as to reduce the whole resistance. In detail, the partial current I2 originates from the one electrode 132 and goes vertically through the hard mask 156 and the free layer 155, across the tunnel barrier 154, and into the seed layer 151, the exchange bias layer 152 and the pinned layer 153. After traveling a certain distance, the partial current I2 again goes across the tunnel barrier 154, through the free layer 155 and hard mask layer 156, and finally reaches the other electrode 132 connected to the same MTJ unit 150. In other words, in the TMR sensor 100 of the present embodiment, a flow direction of the electric current I is parallel to the reference plane 144 of the MTJ unit 150. Moreover, the electrodes 132 via which the electric current I flowing out and in are arranged at the same side (top side) of the MTJ unit 150. Thus, the TMR sensor 100 is a current-in-plane tunneling magnetoresistance sensor.

Figure 2:
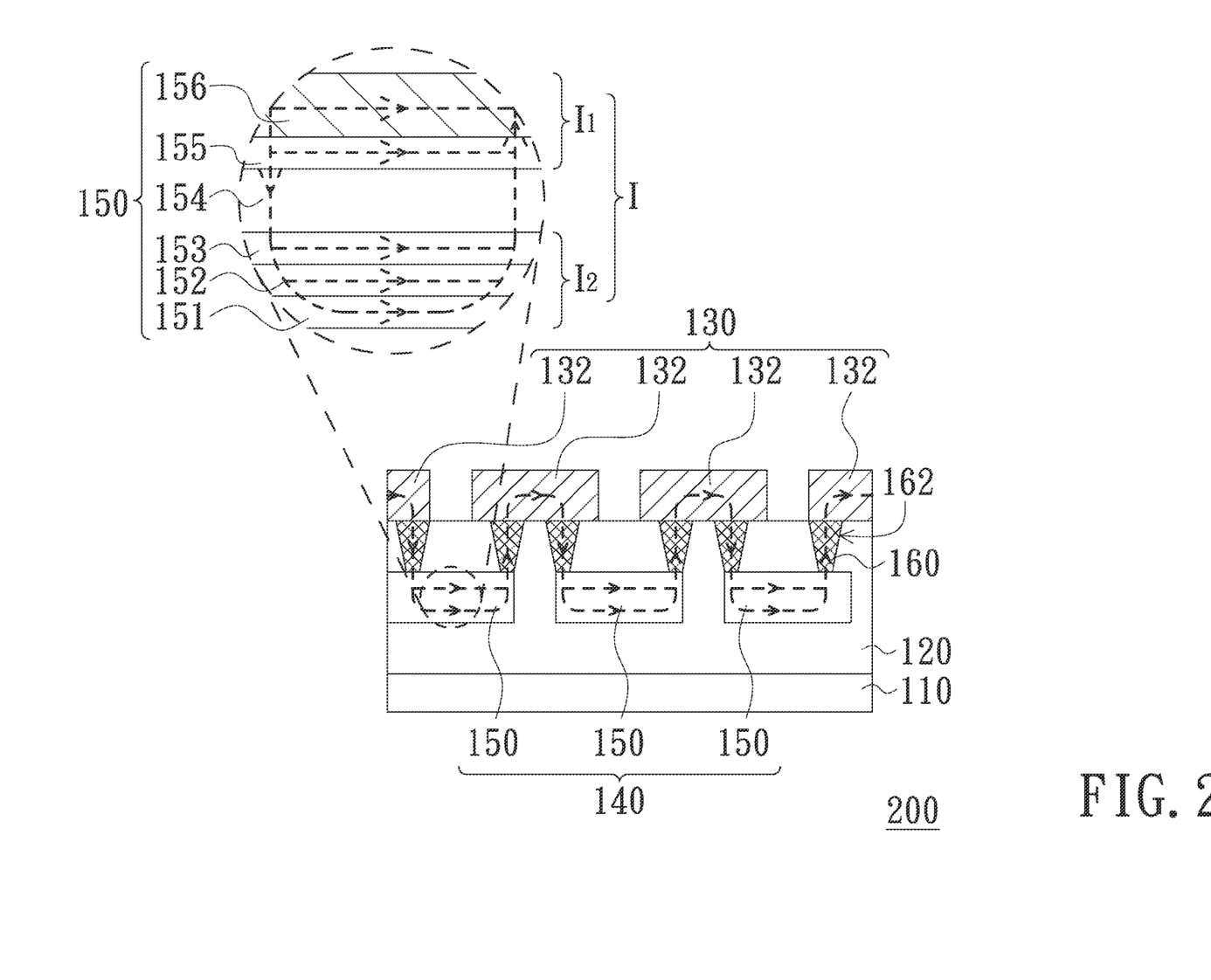
FIG. 2 illustrates a partial, cross-sectional, schematic view of a TMR sensor in accordance with another embodiment of the present invention.

It is noted that, although the electrodes 132 as mentioned are physically and electrically connected to the MTJ units 150, the electrical connection method of the electrodes 132 and the MTJ units 150 is not limited by the embodiment disclosed above. FIG. 2 illustrates a partial, cross-sectional, schematic view of a TMR sensor in accordance with another embodiment of the present invention. Referring to FIG. 2, the TMR sensor 200 in the present embodiment is similar to the TMR sensor 100 except that the TMR sensor 200 further includes a number of contact plugs 160. The contact plugs 160 are formed in the insulating layer 120 and electrically connect the electrodes 132 with corresponding MTJ units 150. The contact plugs 160 are placed at the corresponding positions where the electrodes 132 are intentionally disposed to connect with the MTJ units 150. Thus, two neighboring electrodes 132 are electrically connected to a common MTJ unit 150 by the contact plugs 160 therebetween. For ease of schematic view, only one contact plug 160 is indicated at each corresponding position.

It is noted that, in the present embodiment, the contact plugs 160 can be conventional tungsten plugs. In another embodiment, after a number of contact holes 162 are formed, the contact plugs 160 and the electrode array 130 can be simultaneously formed by using a metal layer (e.g., an aluminum layer). The manufacturing process of the contact plugs 160 and the electrode array 130 is similar to a typical interconnection process, and is not described here.

Figure 3:
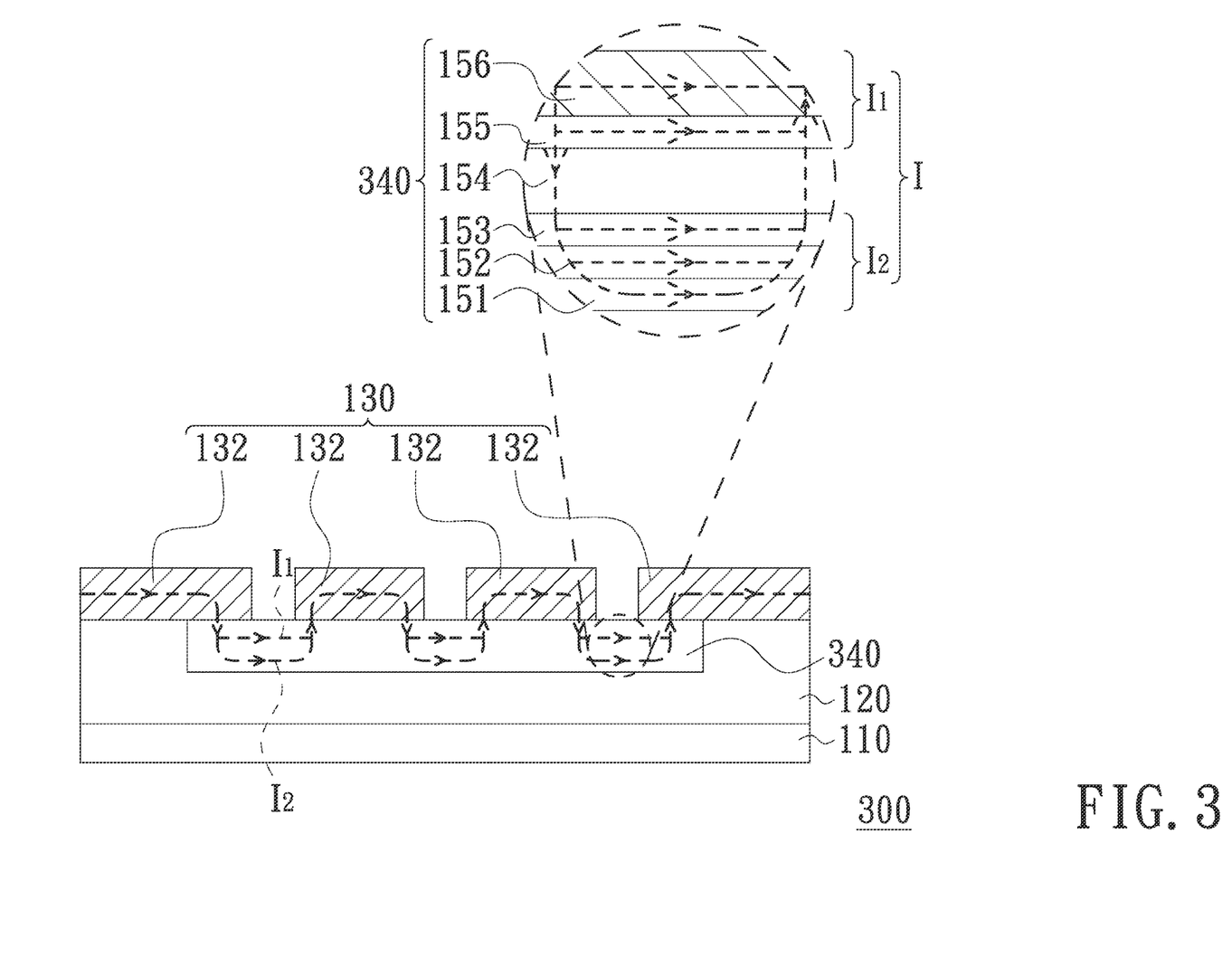
FIG. 3 illustrates a partial, cross-sectional, schematic view of a TMR sensor in accordance with still another embodiment of the present invention.
Figure 4:
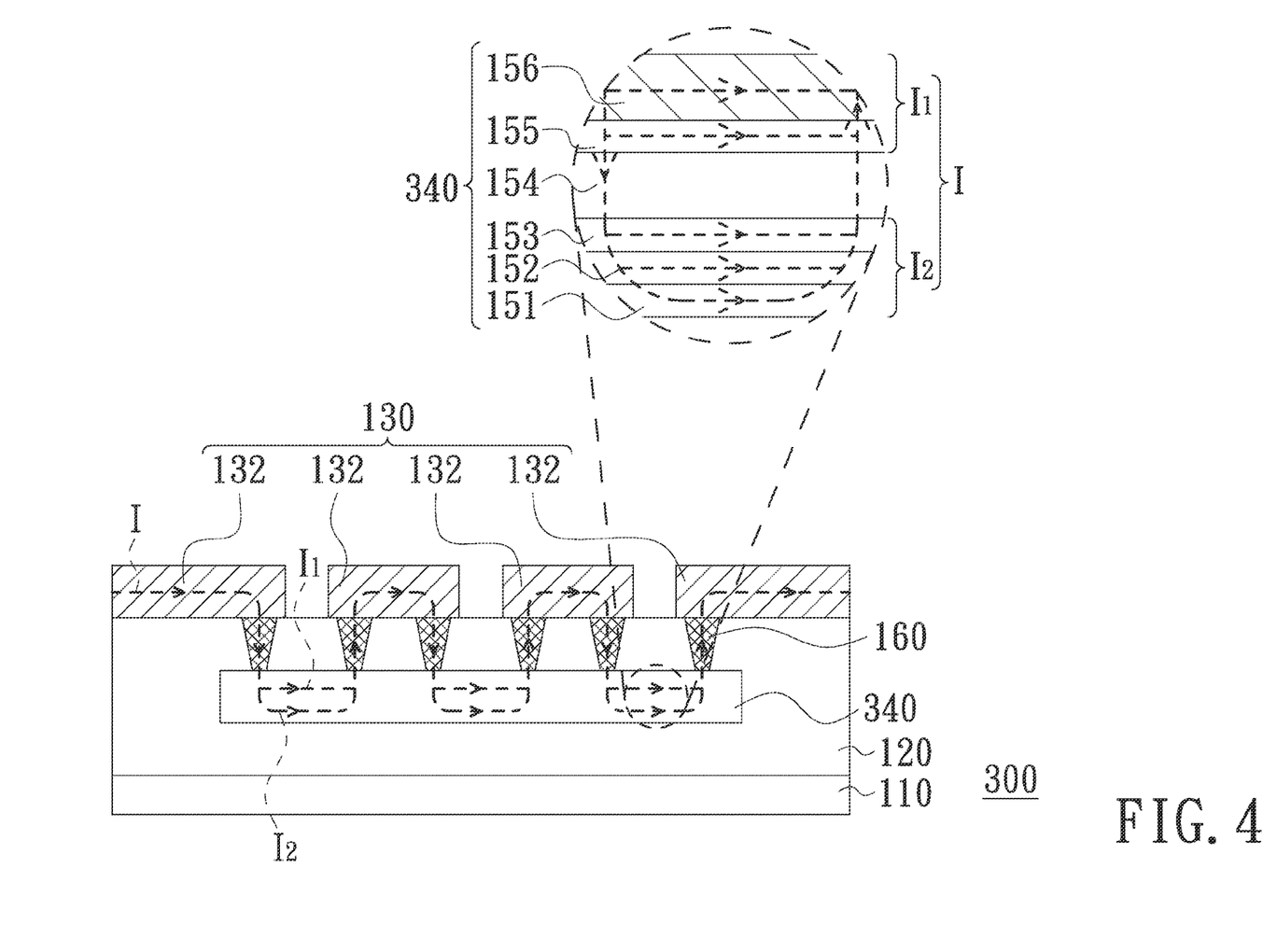
FIG. 4 illustrates a partial, cross-sectional, schematic view of a TMR sensor in accordance with still another embodiment of the present invention.

Particularly, a magnetoresistance ratio (MR ratio) of each of the MTJ units 150 is related to a distance of the two neighboring electrodes 132 connected thereto. The distance of two neighboring electrodes 132 should be in an optimum range. If the distance of two neighboring electrodes 132 is too far or too close, the MR ratio of the MTJ unit 150 will be decreased. In addition, the width and aspect ratio of each of the MTJ units 150 will affect the switching field of the free layer 155. The free layer 155 shows higher coercivity when the MTJ units 150 are in smaller width and lower aspect ratio. That is, the free layer 155 requires higher applied field to switch the magnetic moment thereof, thereby reducing the sensing sensitivity. Therefore, in order to enhance the sensing sensitivity by reducing switching field, the width and aspect ratio of each MTJ unit 150 can be increased. In other embodiments, as shown in FIG. 3 and FIG. 4, a TMR component 340 including a strip-shaped MTJ unit is formed in the insulating layer 120 to reduce the switching field.

According to the principle of the current-in-plane tunneling, (CIPT), if only two electrodes 132 of the electrode array 130 are electrically connected to two ends of the strip-shaped TMR component 340, the distance between the two electrodes 132 will be too far. Thus, the MR ratio of the TMR component 340 will be greatly reduced. This is because the TMR resistance change arising from spin electrons across the tunnel barrier 154 becomes much less weighted when compared to the total resistance dominated by the in-plane conduction resistance. In order to increase the amount of TMR resistance change, a number of electrodes 132 can be formed and electrically connected to the TMR component 340. In such circumstance, the electric current may have higher probability to traverse the tunnel barrier 154 many times, thereby achieving a multiple tunneling effect to increase the MR ratio of the TMR component 340.

Accordingly, the MR ratio of the TMR component 340 can be increased while the switching field is decreased, thereby increasing the sensing sensitivity of the TMR sensor 300.

It is noted that, the shape of the TMR component 340 is not limited by the present embodiment. The TMR component 340 can be a long strip or other elongated shapes.

Similarly, the TMR component 340 can be physically and electrically connected to the electrode array 130, as shown in FIG. 3. Also, the TMR component 340 can be electrically connected to the electrode array 130 by the contact plugs 160, as shown in FIG. 4.

Figure 5:
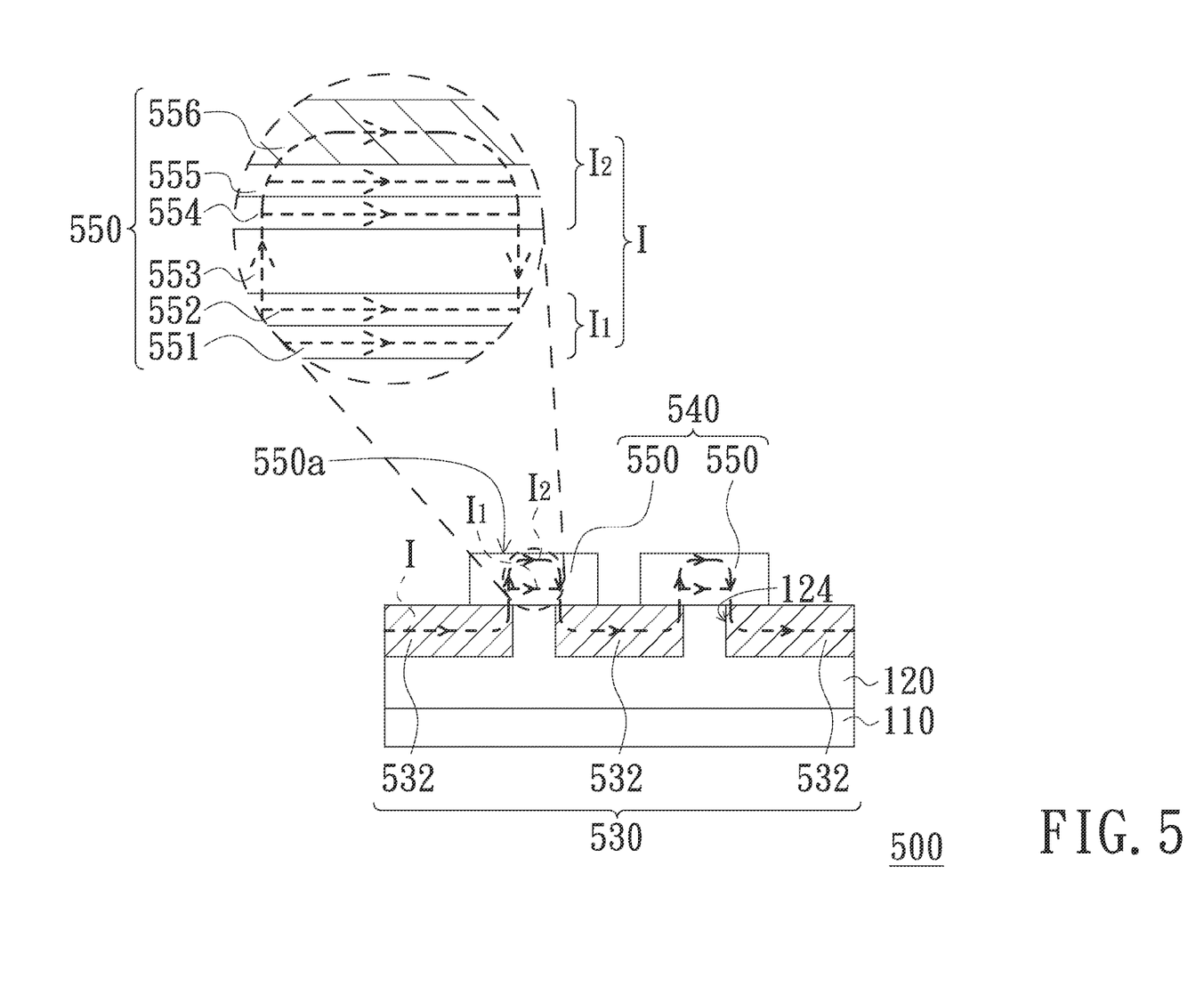
FIG. 5 illustrates a partial, cross-sectional, schematic view of a TMR sensor in accordance with still another embodiment of the present invention.

FIG. 5 illustrates a partial, cross-sectional, schematic view of a TMR sensor in accordance with still another embodiment of the present invention. Referring to FIG. 5, a TMR sensor 500 includes a substrate 110, an insulating layer 120, an electrode array 530 and a TMR component 540. The substrate 110 can be, for example, a silicon substrate covered by an insulating material or a silicon wafer having front-end logic circuits. The insulating layer 120 is formed on the substrate 110. In the present embodiment, the insulating layer 120 defines a number of openings 124. The electrode array 530 includes a number of electrodes 532. The electrodes 532 are separated from each other and embedded in the openings 124. The top surfaces of the electrodes 532 are exposed from the insulating layer 120 through the corresponding openings 124. In detail, in the present embodiment, the insulating layer 120 is patterned by a photolithography process or other suitable processes so as to form the openings 124. Then, a metal material such as tungsten or copper is filled into the openings 124 by a damascene process so as to form the electrodes 532.

Similar to the electrodes 132 in the aforesaid embodiments, the electrodes 532 in the present embodiment are electrically connected to a circuit by metal interconnections or other means. In order to expressively illustrate the TMR sensor 500, the detailed electrical connection of the electrodes 532 to the circuit is not shown in FIG. 5.

Still, referring to FIG. 5, in the present embodiment, the TMR component 540 is disposed on the insulating layer 120 and electrically connected to the electrode array 530. The TMR component 540 includes a number of MTJ units 550 and the MTJ units 550 are separated from each other. Each of the MTJ units 550 is electrically connected to two neighboring electrodes 532. In other words, two neighboring electrodes 532 are electrically connected to a common MTJ unit 550 on both ends. An additional passivation layer (not shown) can also be applied on top of the TMR sensor 500 for protection and reliability concern.

In the present embodiment, each of the MTJ units 550 includes a free layer 552, a pinned layer 554, and a tunnel barrier 553 in between.

Specifically, the MTJ units 550 may further include a seed layer 551, an exchange bias layer 555 and a hard mark 556. The seed layer 551, the free layer 552, the tunnel barrier 553, the pinned layer 554, the exchange bias layer 555, and the hard mark 556 are stacked on the insulating layer 120 sequentially in that order and electrically in contact with the corresponding electrodes 532. In another embodiment, the seed layer 551, the exchange bias layer 555, the pinned layer 554, the tunnel barrier 553, the free layer 552, and hard mask 556 can also be stacked on the insulating layer 120 sequentially in that order and electrically in contact with the corresponding electrodes 532.

It is noted that, the materials of the seed layer 551, the free layer 552, the tunneling barrier 553, the pinned layer 554, the exchange bias layer 555, and the hard mark 556 are respectively similar to or identical to the material of the seed layer 151, the free layer 155, the tunneling barrier 154, the pinned layer 153, the exchange bias layer 152, and the hard mark 156 in aforesaid embodiments, and are not described here.

According to the principle of the current-in-plane tunneling, the MTJ units 550 should have an optimum current traveling distance. Thus, when an electric current I flows from one electrode 532 of the electrode array 530 into the MTJ unit 550 electrically connected to the one electrode 532, one portion (i.e., partial current I1) of the electric current I flows directly through the seed layer 551 and the free layer 552 parallel to the reference plane 550a and arrives at the other electrode 532 connected to the same MTJ unit 550. Meanwhile, the other portion (i.e., partial current I2) of the electric current I tends to form a secondary path so as to reduce the whole resistance. In detail, the partial current I2 originates from the one electrode 532 and goes vertically through the seed layer 551 and the free layer 552, across the tunnel barrier 553, and into the pinned layer 554, the exchange bias layer 555 and the hard mask 556. After traveling a certain distance, the partial current I2 again goes across the tunnel barrier 553, through the free layer 552 and the seed layer 551, and finally reaches the other electrode 532 connected to the same MTJ unit 550. In other words, in the TMR sensor 500 of the present embodiment, a flow direction of the electric current I is parallel to the reference plane 550a of the MTJ unit 550. Moreover, the electrode 532 via which the electric current I flowing out and in are arranged at the same side (bottom side) of the MTJ unit 550. Thus, the TMR sensor 500 is a current-in-plane tunneling magnetoresistance sensor.

As shown in FIG. 5, in the present embodiment, the TMR component 540 of the TMR sensor 500 is disposed on the electrode array 530 and electrically connected to the electrode array 530. That is, the electrode array 530 is adjacent to the TMR component 540. After the formation of TMR component 540, no further metal layer is disposed above the TMR component 540. It is noted that, by such arrangement, the TMR component 540 can avoid the deterioration of the metal-layer manufacturing process, such as thermal energy accumulation, stress accumulation and interface diffusion. Thus, the performance of the TMR component 540 will be maintained.

It is noted that, although the electrodes 532 are physically and electrically connected to the MTJ units 550, the way of electrical connection between the electrodes 532 and the MTJ units 550 is not limited by the embodiment disclosed above. In another embodiment, referring to FIG. 6, the TMR sensor further includes a number of contact plugs 170. The contact plugs 170 are formed in the insulating layer 120. The contact plugs 170 electrically connect the electrode array 530 with corresponding MTJ units 550.

Figure 6:
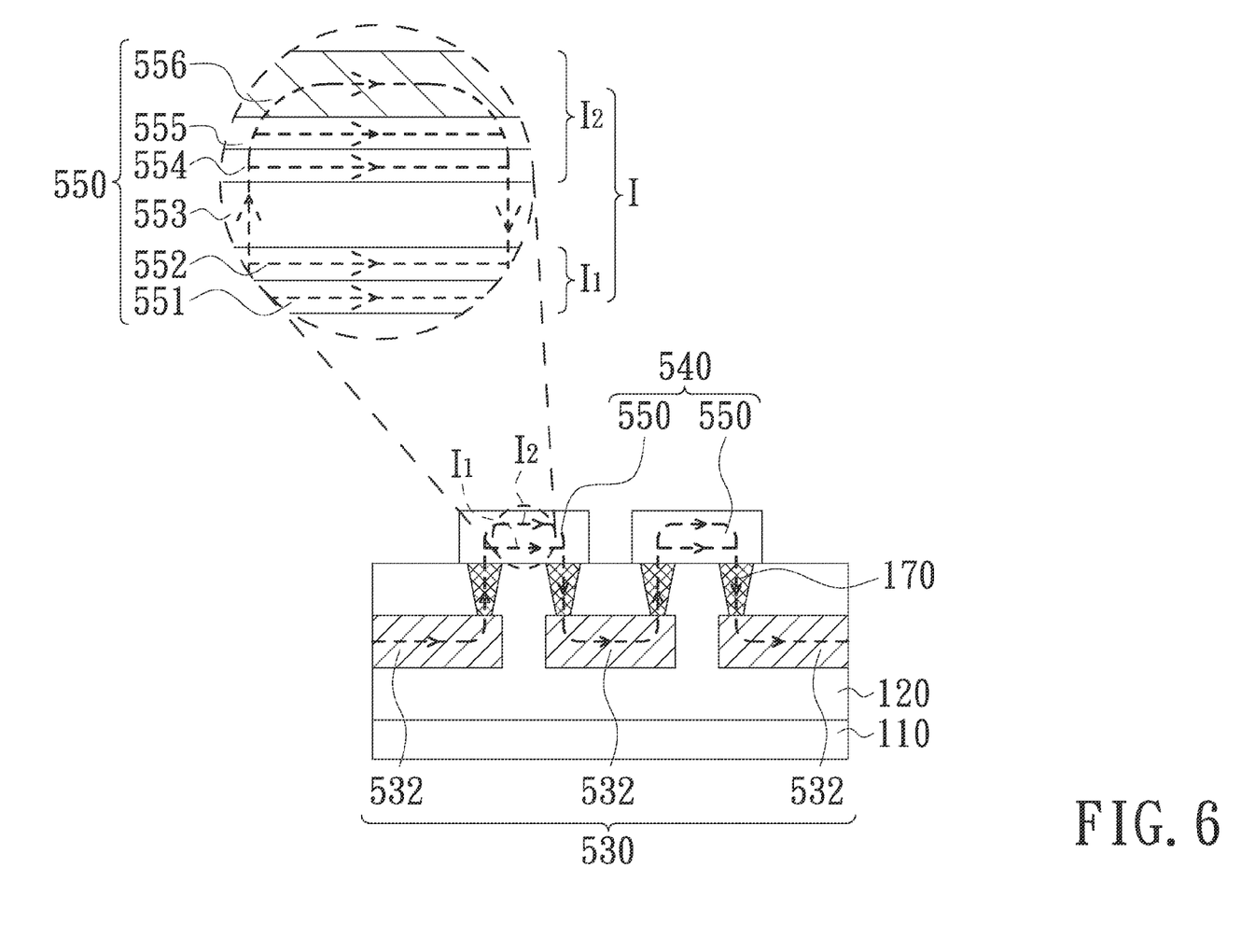
FIG. 6 illustrates a partial, cross-sectional, schematic view of a TMR sensor in accordance with still another embodiment of the present invention.
Figure 7:
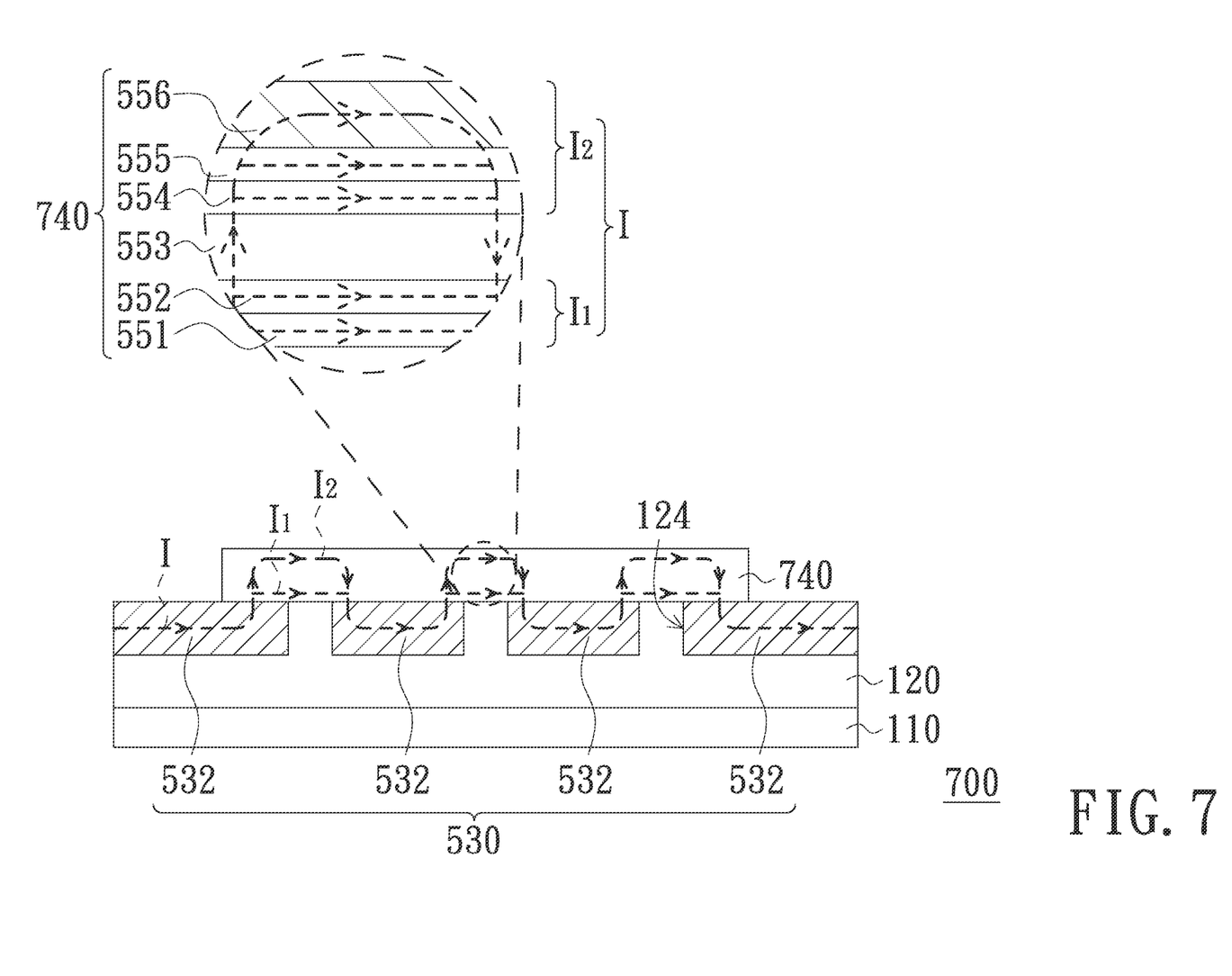
FIG. 7 illustrates a partial, cross-sectional, schematic view of a TMR sensor in accordance with still another embodiment of the present invention.
Figure 8:
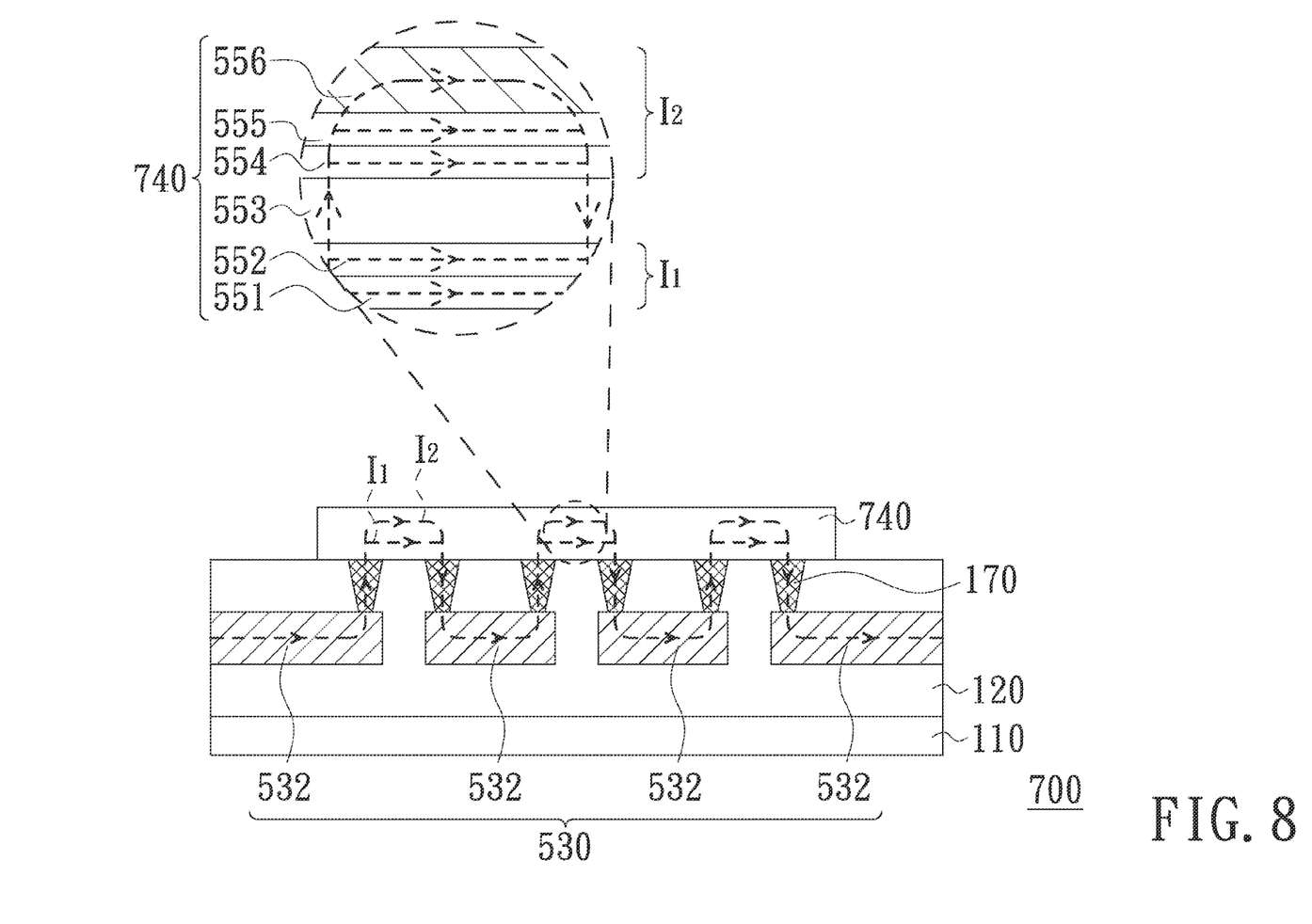
FIG. 8 illustrates a partial, cross-sectional, schematic view of a TMR sensor in accordance with still another embodiment of the present invention.

Additionally, the MR ratio of the TMR component can be increased while the switching field is decreased, thereby increasing the sensing sensitivity of the TMR sensor. As shown in FIG. 7 and FIG. 8, a TMR component 740 including a strip-shaped MTJ unit is substituted for the TMR component 540 including the MTJ units 550 as shown in FIG. 5 and FIG. 6. In the TMR sensor 700, as shown in FIG. 7 and FIG. 8, the TMR component 740 is disposed on the insulating layer 120, and the electrode array 530 is embedded in the insulating layer 120. The electrode array 530 can form electrical connection with the TMR component 740 by either direct contact or assistance of contact plugs 170. The other structures of the TMR sensor 700 are similar to or identical to the TMR sensor 300, and are not described here.

Figure 9:
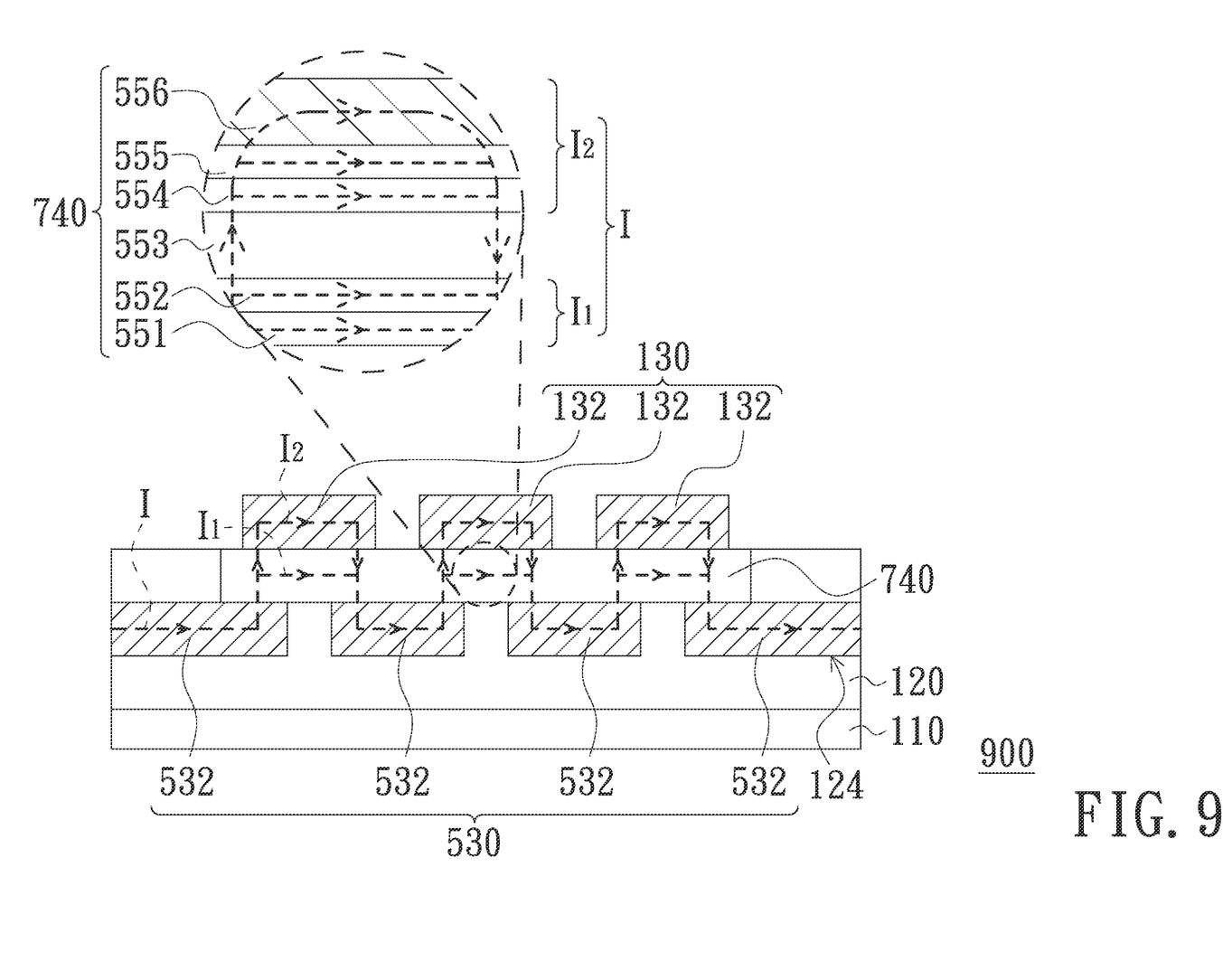
FIG. 9 illustrates a partial, cross-sectional, schematic view of a TMR sensor in accordance with still another embodiment of the present invention.

FIG. 9 illustrates a partial, cross-sectional, schematic view of a TMR sensor in accordance with still another embodiment of the present invention. Referring to FIG. 9, a TMR sensor 900 includes a TMR component 740 including a strip-shaped MTJ unit. It is noted that, the TMR sensor 900 further includes a secondary electrode array 130 disposed on, adjacent to and electrically connected with the TMR component 740 besides a primary electrode array 530 disposed below, adjacent to and electrically connected with the TMR component 740. That is, the TMR component 740 is located between the primary electrode array 530 and the secondary electrode array 130. In detail, the primary electrode array 530 includes a number of electrodes 532 disposed in the openings 124 of the insulating layer 120. The secondary electrode array 130 includes a number of electrodes 132 disposed on the TMR component 740. The electrodes 532 of the primary electrode array 530 are formed in a single metal layer, and the electrode electrodes 132 of the secondary electrode array 130 are formed in another single metal layer. The electrodes 132 and the electrodes 532 are arranged alternately along the extending direction of the strip-shaped MTJ unit. Only the electrodes 532 at two ends of the TMR component 740 lead to the metal interconnections. The other electrodes 532 as well as all the electrodes 132 are electrically in contact with the TMR component 740 only. That is, the electrode array 130 is not electrically connected to the metal interconnections. It is noted that, in other embodiments, it can be the electrode array 130 electrically connecting the metal interconnections, and not the electrode array 530.

Figure 10:
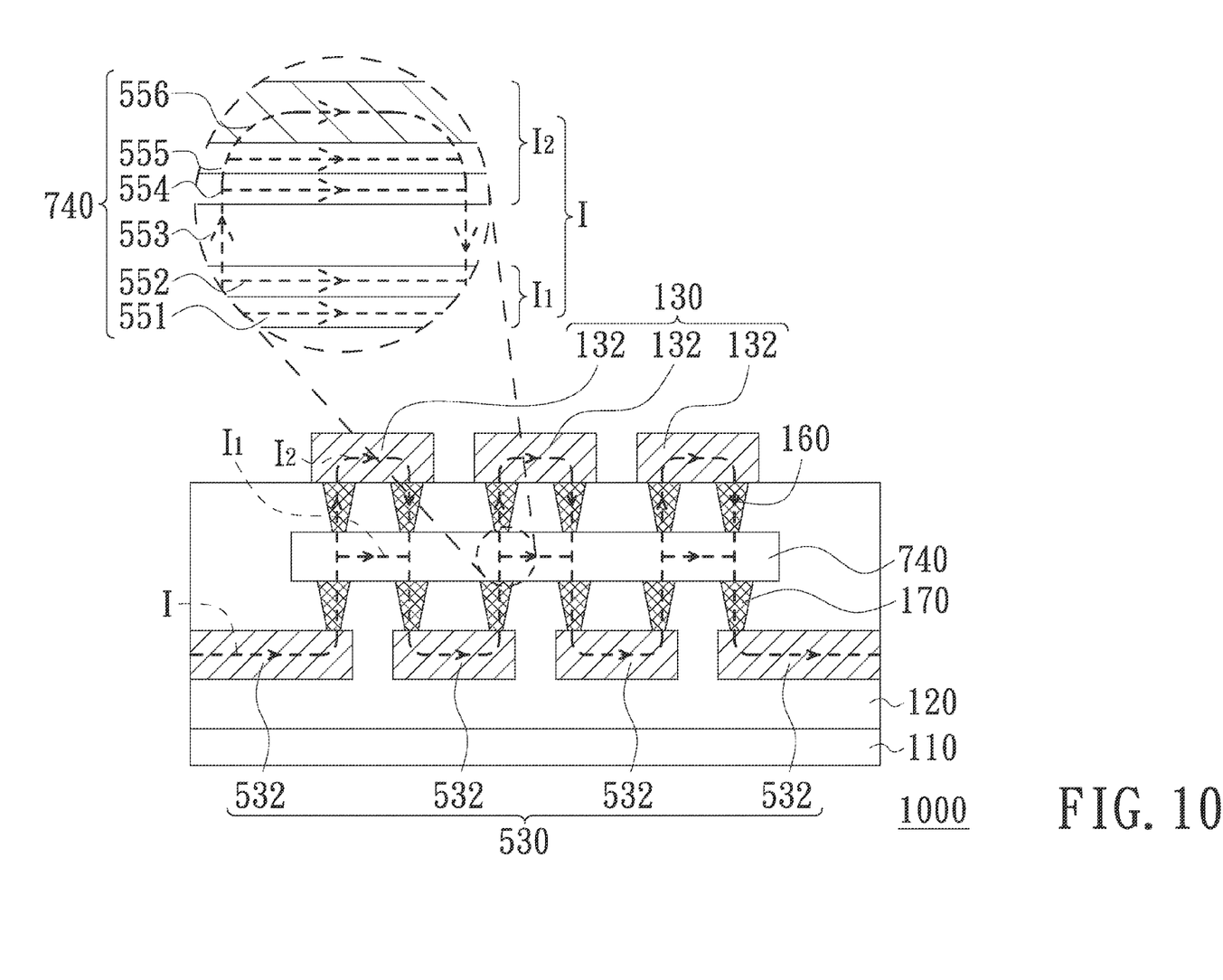
FIG. 10 illustrates a partial, cross-sectional, schematic view of TMR sensor in accordance with still another embodiment of the present invention.

In addition, in the present embodiment, the TMR component 740 is in direct contact with the electrode array 130 and the electrode array 530. In other embodiments, as shown in FIG. 10, the TMR sensor 1000 can further includes a number of contact plugs 160 and a number of contact plugs 170. The contact plugs 160 are formed in the insulating layer 120 and electrically connect the electrodes 132 with the TMR component 740. While the contact plugs 170 are formed in the insulating layer 120 and electrically connect the electrodes 532 with the TMR component 740. In other words, the TMR component 740 is electrically connected to the electrode array 130 by the contact plugs 160, and electrically connected to the electrode array 530 by the contact plugs 170.

In summary, the TMR sensor of the present invention belongs to a CIP-TMR sensor with contact electrodes disposed at a same level. That is, the electrodes directly or indirectly connecting to the TMR component can be formed in single metal layer. Thus, comparing to the CPP-TMR sensor, the CIP-TMR sensor of the present invention can be manufactured by a more simplified process, thereby reducing the production cost. Moreover, in a preferable embodiment of the present invention, the electrodes can be disposed below the TMR component. In other words, after the formation of TMR component, no metal layer is disposed above. The deterioration due to the metal-layer manufacturing process such as thermal energy accumulation, stress accumulation and interface diffusion will be avoided and the performance of the TMR component can be therefore maintained.

Additionally, the TMR sensor of the present invention can include the TMR component comprising a strip-shaped MTJ unit electrically connected to multiple floating electrodes. Thus, the switching field can be reduced due to lower shape anisotropy and the MR ratio can be increased due to the multiple-tunneling effect. Both factors contribute to the proposed TMR sensor with higher sensing signal and sensitivity.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A tunneling magnetoresistance sensor, comprising:
a substrate;
an insulating layer disposed on the substrate;
a tunneling magnetoresistance component in contact with the insulating layer, the tunneling magnetoresistance component comprising at least one magnetic tunneling junction unit; and
a first electrode array disposed in contact with the insulating layer and, the first electrode array comprising a plurality of first electrodes;
the first electrode array being electrically connected to the tunneling magnetoresistance component to form a current-in-plane tunneling conduction device, wherein each of the at least one magnetic tunneling junction unit is electrically connected to at least two neighboring first electrodes of the first electrode array.

2. The tunneling magnetoresistance sensor of claim 1, wherein the first electrode array is formed in a single metal layer and in direct contact with the tunneling magnetoresistance component correspondingly.

3. The tunneling magnetoresistance sensor of claim 1, wherein the first electrode array is located above the tunneling magnetoresistance component correspondingly.

4. The tunneling magnetoresistance sensor of claim 1, wherein the first electrode array is located below the tunneling magnetoresistance component correspondingly.

5. The tunneling magnetoresistance sensor of claim 1, further comprising a plurality of first contact plugs, the first contact plugs being disposed in the insulating layer and electrically connecting the first electrodes with the at least one magnetic tunneling junction unit.

6. The tunneling magnetoresistance sensor of claim 1, further comprising a second electrode array, the second electrode array comprising a plurality of second electrodes, the second electrode array being electrically connected to the tunneling magnetoresistance component to form a current-in-plane tunneling conduction device.

7. The tunneling magnetoresistance sensor of claim 6, wherein the tunneling magnetoresistance component is located between the first electrode array and the second electrode array.

8. The tunneling magnetoresistance sensor of claim 6, further comprising a plurality of second contact plugs, the second contact plugs being disposed in the insulating layer and electrically connecting the second electrodes with the magnetic tunneling junction units.

9. The tunneling magnetoresistance sensor of claim 1, wherein the at least one magnetic tunneling junction unit is a strip-shaped magnetic tunneling junction unit.

10. The tunneling magnetoresistance sensor of claim 9, wherein the plurality of first electrodes are electrically connected to the strip-shaped magnetic tunneling junction unit.

11. The tunneling magnetoresistance sensor of claim 9, further comprising a plurality of second electrodes electrically connected to the strip-shaped magnetic tunneling junction unit.

* * * * *